United States Patent
Matsuzono et al.

[11] Patent Number: 5,914,839
[45] Date of Patent: Jun. 22, 1999

[54] MR DEVICE WITH ANTI-FERRO MAGNETIC FIELD ANTI-PARALLEL TO SENSE CURRENT MAGNETIC FIELD

[75] Inventors: Atsushi Matsuzono; Satoshi Sasaki, both of Kanagawa, Japan

[73] Assignee: Sony Corporation, Tokyo, Japan

[21] Appl. No.: 08/899,862

[22] Filed: Jul. 24, 1997

[30] Foreign Application Priority Data

Jul. 26, 1996 [JP] Japan .................................. 8-197548

[51] Int. Cl.⁶ .................................................. G11B 5/39
[52] U.S. Cl. ............................................................ 360/113
[58] Field of Search .................................... 360/113, 126, 360/125; 324/252; 338/32 R

[56] References Cited

U.S. PATENT DOCUMENTS

| | | | |
|---|---|---|---|
| 5,696,656 | 12/1997 | Gill et al. | 360/113 |
| 5,725,963 | 3/1998 | Iwasaki et al. | 428/611 |
| 5,748,399 | 5/1998 | Gill | 360/113 |
| 5,768,066 | 6/1998 | Akiyama et al. | 360/113 |
| 5,768,071 | 6/1998 | Lin | 360/113 |
| 5,780,176 | 7/1998 | Iwasaki et al. | 428/692 |

*Primary Examiner*—Jefferson Evans
*Attorney, Agent, or Firm*—Hill & Simpson

[57] ABSTRACT

A magneto-resistance effect device having improved sensitivity in which an effective anisotropic magnetic field operating on a magneto-resistance effect layer is not increased by the sense current magnetic field. The device includes a magnetic field detection unit having a magneto-resistance effect film exhibiting a magneto-resistance effect. The magnetic field detection unit is fed with a sense current in a direction substantially parallel to an external magnetic field. The device also includes an anti-ferromagnetic film arranged neighboring to the magneto-resistance effect film of the magnetic field detection unit. The direction of a magnetic field emanating from the anti-ferromagnetic film is substantially anti-parallel to the direction of a sense current magnetic field generated by the sense current and impressed on the magneto-resistance effect film of the magnetic field detection unit.

10 Claims, 6 Drawing Sheets

MR DEVICE WITH ANTI-FERRO MAGNETIC FIELD ANTI-PARALLEL TO SENSE CURRENT MAGNETIC FIELD

BACKGROUND OF THE INVENTION

This invention relates to a magneto-resistance effect device used for a magneto-resistance effect head for detecting a playback signal by the magneto-resistance effect and that is advantageously applied to, for example, a hard disc device, or a magnetic sensor for detecting geomagnetism by the magneto-resistance effect.

In a magnetic recording/reproducing device, such as a hard disc device, a higher recording density is required for further improving surface recording density of a magnetic recording medium. Thus, for realizing of high recording density, a magneto-resistance effect type thin-film magnetic head (MR head) employing a magneto-resistance effect device of high magnetic field sensitivity, has come to be used.

The magneto-resistance effect device 100 illustrated in FIG. 1, used for an MR head which has achieved high recording density, has a substantially rectangular magneto-resistance effect layer 101 and a pair of electrodes 102A, 102B arranged on both longitudinal ends of the magneto-resistance effect layer 101. In the magneto-resistance effect device 100, a magneto-resistance effect stabilizing layer for magnetically stabilizing the magneto-resistance effect layer 101 or a non-magnetic layer is layered in the direction of the film thickness of the magneto-resistance effect layer. When reproducing a magnetic field signal recorded on the magnetic recording medium, an area sandwiched between the paired electrodes 102A, 102B operates as a magnetically sensitive area R to which a pre-set constant amount of the sense current is supplied from the paired electrodes 102A, 102B.

If an external magnetic field, such as a magnetic field signal, is impressed across the magneto-resistance effect device 100 described above, the resistance value of the magneto-resistance effect layer 101 is changed. In the magneto-resistance effect device 100, the sense current is supplied to the magneto-resistance effect layer 101 for specifying the changes in resistance in terms of changes in voltage. In the MR head employing this magneto-resistance effect device 100, the changes in voltage of the sense current are detected for reproducing the signal 1f of the magnetic recording medium. This MR head is classified as either a so-called transverse MR head supplying the sense current in a substantially parallel direction to the magnetic recording medium or a so-called longitudinal MR head supplying the sense current in a substantially perpendicular direction to the magnetic recording medium.

The transverse MR head is arranged so that the longitudinal direction of the magneto-resistance effect device is substantially parallel to the magnetic recording medium. In the transverse MR head, the magneto-resistance effect layer of the magneto-resistance effect device is magnetized in a direction substantially parallel to the magnetic recording medium, and the signal magnetic field is impressed from a direction substantially perpendicular to the direction of magnetization of the magneto-resistance effect layer.

In the longitudinal MR head, the output remains constant under constant sense current density condition, even if the track width is reduced. Thus, if the track width is reduced, a higher output is realized. Moreover, since the electrically conducive material arranged on a sliding surface of the longitudinal MR head along which slides the magnetic recording medium can be of the same potential, high resistance against electrostatic destruction is achieved. In addition, with the longitudinal MR head, the sense current magnetic field is produced if the sense current is supplied. Since the sense current magnetic field stabilizes the magneto-resistance effect device along the easy axis, no magnetic domain stabilizing layer is required.

If, with the above-described transverse and longitudinal MR heads, the sense current is supplied to the magneto-resistance effect device, the sense current magnetic field is generated from the sense current. This sense current magnetic field is an annular magnetic field centered about the maximum sense current density distribution.

Also, the magneto-resistance effect device is arranged so that the position of the magneto-resistance effect layer is not coincident with the center of the sense current magnetic field, because the magneto-resistance effect stabilizing layer or the non-magnetic layer is layered on the magneto-resistance effect layer. Thus the annular sense current magnetic field is applied to the magneto-resistance effect layer.

In the transverse MR head, since the direction of the sense current magnetic field is substantially perpendicular to the direction of magnetization of the magneto-resistance effect layer, the sense current magnetic field operates as a bias magnetic field for the magneto-resistance effect layer. Therefore, with the transverse MR head, the playback sensitivity can be improved by utilizing the sense current magnetic field as the bias magnetic field.

On the other hand, with the longitudinal MR head, employing the above-described magneto-resistance effect device, the direction of the sense current magnetic field generated in the magneto-resistance effect layer is substantially parallel to the direction of magnetization of the magneto-resistance effect layer. With the longitudinal MR head, the direction of magnetization of the magneto-resistance effect layer is oriented along the direction of easy axis. By this sense current magnetic field, the magnetic field of the same direction as the anisotropic magnetic field of the magneto-resistance effect layer, referred to herein as an effective anisotropic magnetic field, is increased. That is, the sense current magnetic field is generated in the direction of the track width of the magneto-resistance effect device for increasing the effective anisotropic magnetic field. This effective anisotropic magnetic field is impressed on the magneto-resistance effect layer for increasing the magnetization of the magneto-resistance effect layer oriented along the direction of easy axis.

Thus, with the magneto-resistance effect device used in the longitudinal MR head, the direction of magnetization is not liable to be changed even on impression of a signal magnetic field from the magnetic recording medium, thus deteriorating the magneto-resistance effect characteristics. That is, the longitudinal MR head has a defect that the magneto-resistance effect device is lowered in sensitivity by the sense current magnetic field.

It may also be envisaged to increase the amount of the sense current for increasing the sensitivity of the magneto-resistance effect device used in the longitudinal MR head. However, if the amount of the sense current s increased, the sense current magnetic field is increased simultaneously, so that, in the magneto-resistance effect device, the effective anisotropic magnetic field is increased. Therefore, with this magneto-resistance effect device, the magneto-resistance effect device cannot be improved in sensitivity by increasing the amount of the sense current, such that the above problem cannot be solved.

SUMMARY OF THE INVENTION

It is therefore an object of the present invention to provide a magneto-resistance effect device which can be improved insensitivity without the effective anisotropic magnetic field being impressed across the magneto-resistance effect layer.

The present invention provides a magnetic field detection unit having a magneto-resistance effect film exhibiting a magneto-resistance effect. The magnetic field detection unit is fed with a sense current in a direction substantially parallel to an external magnetic field. The device also includes an anti-ferromagnetic film arranged neighboring to the magneto-resistance effect film of the magnetic field detection unit. The direction of a magnetic field emanating from the anti-ferromagnetic film is substantially anti-parallel to the direction of a sense current magnetic field generated by the sense current and impressed on the magneto-resistance effect film of the magnetic field detection unit.

In the above magneto-resistance effect device according to the present invention, the direction of the magnetic field emanating from the anti-ferromagnetic film is anti-parallel to the direction of the sense current magnetic field impressed across the magneto-resistance effect film. Thus, with the present magneto-resistance effect device, the sense current magnetic field impressed on the magneto-resistance effect film is canceled by the magnetic field emanating from the anti-ferromagnetic film so that the sense current magnetic field impressed across the magneto-resistance effect film is apparently not present and hence the external magnetic field, such as the signal magnetic field of the magnetic recording medium, can be detected to high sensitivity without the effective anisotropic magnetic field being impressed across the magneto-resistance effect film.

With the magneto-resistance effect device according to the present invention, the exchange bias magnetic field emanating from the anti-ferromagnetic film cancels the sense current magnetic field which is generated from the sense current supplied to the magneto-resistance effect layer and which is impressed across the magneto-resistance effect film. Thus, with the present magneto-resistance effect device, the external magnetic field can be detected to high sensitivity without the effective anisotropic magnetic field by the sense current magnetic field being impressed across the magneto-resistance effect film.

Also, with the magneto-resistance effect device according to the present invention, the exchange bias magnetic field at least partially cancels the sense current magnetic field even at the time of detecting the external magnetic field using a high-density sense current. Thus, with the present magneto-resistance effect device, the effect of the effective anisotropic magnetic field on the magneto-resistance effect layer may be reduced to enable high sensitivity detection of the external magnetic field.

DESCRIPTION OF THE PREFERRED EMBODIMENTS

Figure 1:
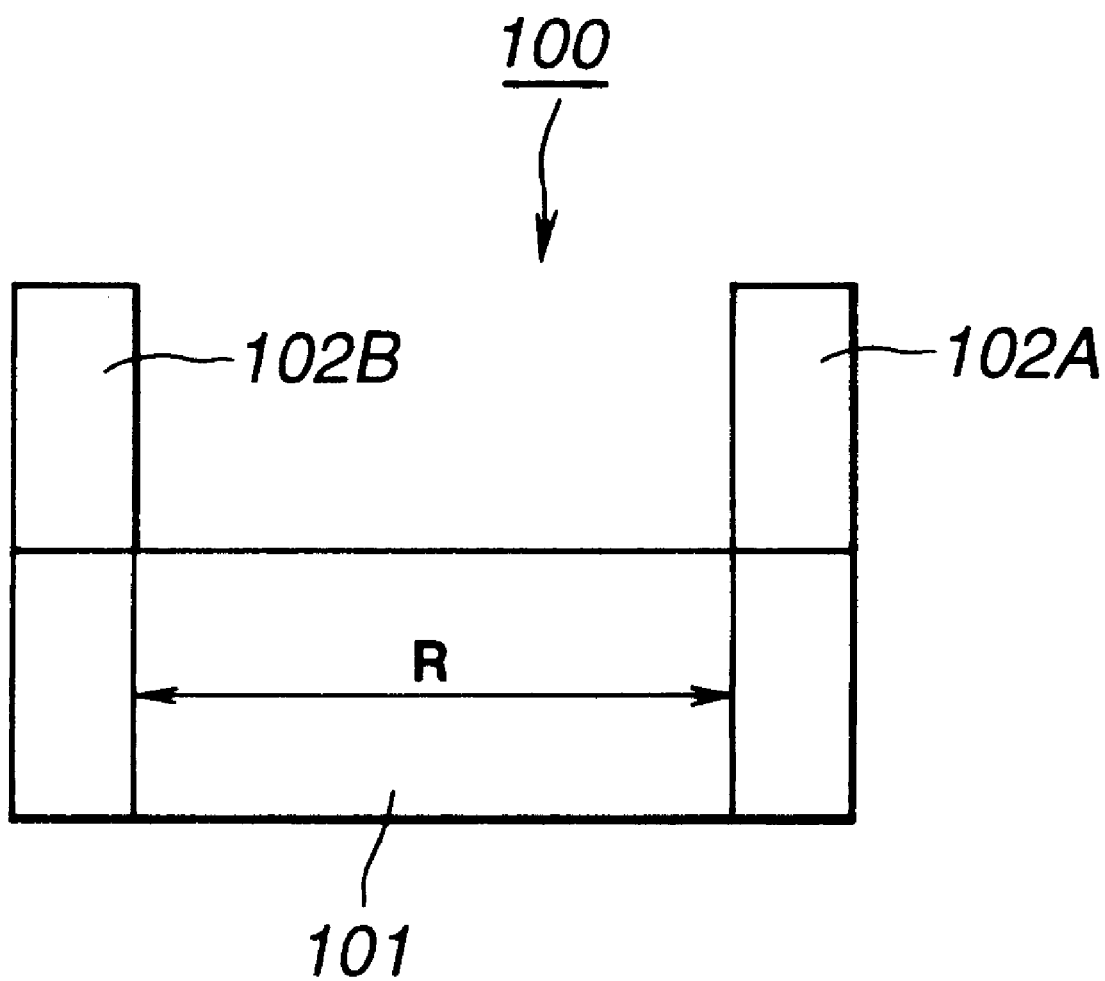
FIG. 1 is a schematic plan view showing an example of a conventional magneto-resistance effect device.

Referring to the drawings, preferred embodiments of the magneto-resistance effect device of the present invention will be explained in detail.

Figure 2:
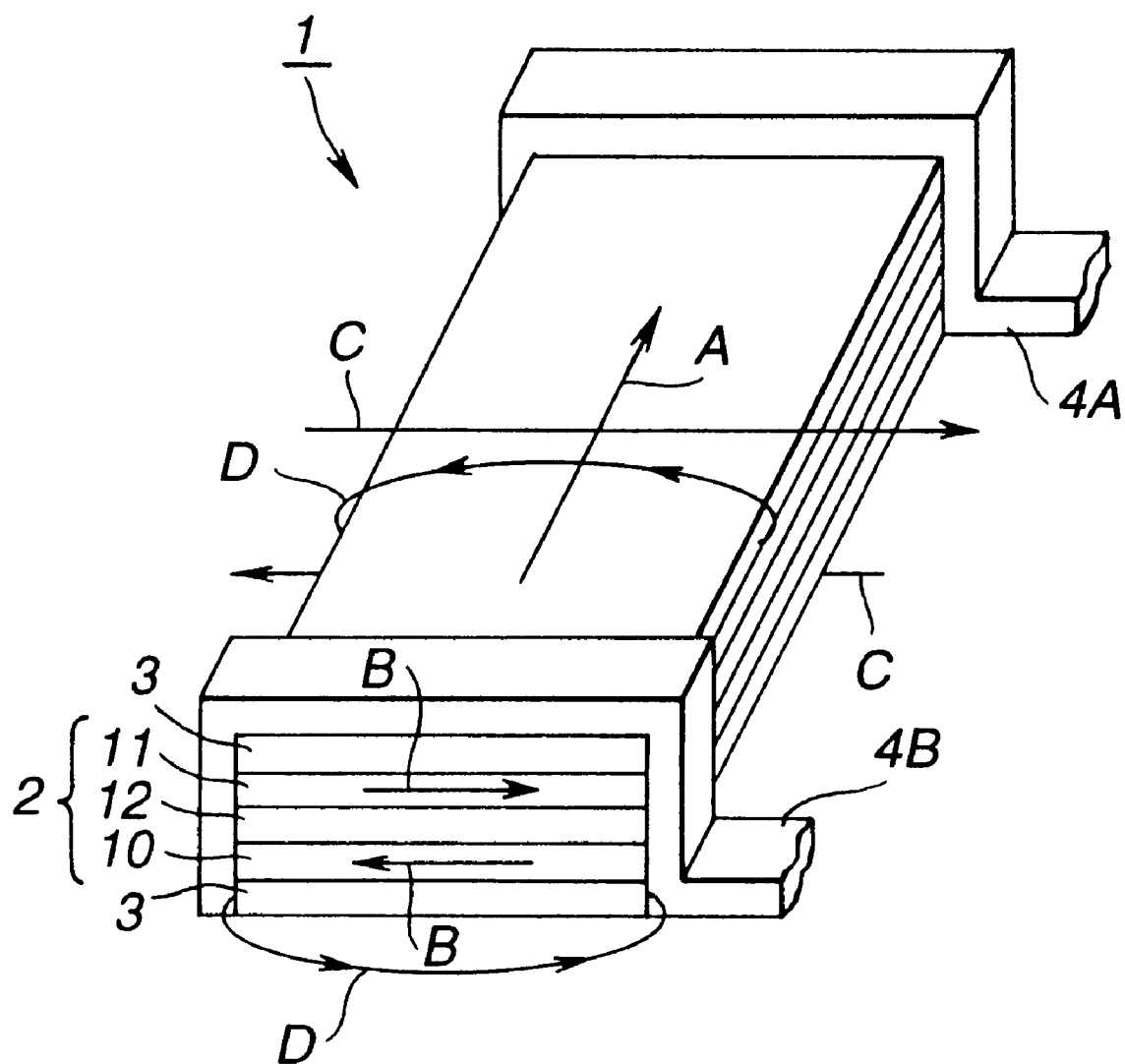
FIG. 2 is a schematic perspective view showing a magneto-resistance effect device according to the present invention.

Referring first to FIG. 2, a magneto-resistance effect device 1 (MR device 1) according to a first embodiment includes a substantially rectangular magneto-resistance effect layer 2, an anti-ferromagnetic film 3, layered on this magneto-resistance effect layer 2, and a pair of electrodes 4A, 4B, provided on both longitudinal ends of the magneto-resistance effect layer 2.

This MR device 1 senses the external magnetic field, such as a signal magnetic field from a magnetic recording medium, and is configured for supplying a constant sense current from the paired electrodes 4A, 4B for detecting the external magnetic field. This MR device 1 is arranged so that the longitudinal direction of the magneto-resistance effect layer 2 will be substantially parallel to the direction of the external magnetic field. The magneto-resistance effect layer 2 is fed with the sense current in a direction substantially parallel to its longitudinal direction.

In the present embodiment, the magneto-resistance effect layer 2 operates as a sensor for detecting the external magnetic field and is made up of a first magneto-resistance effect layer 10 and a second magneto-resistance effect layer 11 layered to each other with a non-magnetic insulating film 12 in-between. The first and second magneto-resistance effect films 10 and 11 are each comprised of a soft magnetic film exhibiting magneto-resistance effect properties such as Ni—Fe, Ni—Fe—Co or Fe—Co, Ni—Fe compounded with Co. The non-magnetic insulating film 12 is a non-magnetic insulating material such as $Al_2O_3$ or $SiO_2$. In the following explanation, the first and second magneto-resistance effect films 10 and 11 are collectively referred to as 'magneto-resistance effect films 10, 11'.

The MR device 1 has the anti-ferromagnetic films 3 for generating the magnetic field canceling the sense current magnetic field generated by the sense current, as will be explained subsequently. This anti-ferromagnetic films 3 are each a film for inhibiting the sense current magnetic field being impressed across the magneto-resistance effect films 10 and 11. In the present embodiment, the anti-ferromagnetic film 3 is arranged next to the first and second magneto-resistance effect films 10 and 11.

Specifically, the anti-ferromagnetic films 3, 3 are layered in the direction of the film thickness on the opposite side of the first magneto-resistance effect film 10 with respect to the non-magnetic insulating film 12 and on the opposite side of the second magneto-resistance effect film 11 with respect to the non-magnetic insulating film 12. That is, the MR device 1 is adapted for being sandwiched between the paired anti-ferromagnetic films 3, 3.

In the instant embodiment, the anti-ferromagnetic films 3 are formed of materials, such as Fe—Mn, Ni—Mn or Ir—Mn. The anti-ferromagnetic films 3 are formed so that the direction thereof is anti-parallel to the direction of the sense current magnetic field which will be explained subsequently.

This MR device 1 has a pair of electrodes 4A, 4B for supplying the sense current to the above-mentioned first and second magneto-resistance effect device 10, 11. These electrodes 4A, 4B are formed of a non-magnetic electrically conductive materials, such as Cu, and are electrically connected to both longitudinal ends of the MR device 1. At this time, the paired electrodes 4A and 4b are connected to the first and second magneto-resistance effect device 10, 11 along with the above-mentioned anti-ferromagnetic films 3.

However, the paired electrodes 4A, 4B may be connected only to the magneto-resistance effect layer 2 without being connected to the anti-ferromagnetic films 3. Specifically, the anti-ferromagnetic films 3 may be formed in an area sandwiched between the paired electrodes 4A, 4B so as to be out of contact with the paired electrodes 4A, 4B.

The above-described MR device 1 detects the external magnetic field, such as the signal magnetic field from a magnetic recording medium or geomagnetism.

For detecting the external magnetic field, the pre-set constant sense current is fed to the magneto-resistance effect layer 2 of the MR device 1. This sense current is supplied in a direction substantially parallel to the longitudinal direction of the magneto-resistance effect layer 2.

The magneto-resistance effect films 10, 11 are magnetized in a direction substantially perpendicular to their longitudinal direction, as shown at B in FIG. 2. This direction is the easy axis. The magneto-resistance effect films 10, 11 are also designed so that the direction of magnetization will be anti-parallel to each other. If the external magnetic field is impressed across these magneto-resistance effect films 10, 11, the external magnetic field modifies the direction of magnetization of the MR device 1 against the anisotropic magnetic field of the MR device 1.

With the magneto-resistance effect films 10, 11, the electrical resistance is changed depending on the angle between the direction of magnetization and the flowing direction of the sense current. In the absence of the external magnetic field, the direction of magnetization of the magneto-resistance effect films 10, 11 and the sense current flowing direction are substantially perpendicular to each other. In such case, the resistance value for the sense current takes a minimum value. In the presence of the impressed external magnetic field, the direction of magnetization of the magneto-resistance effect films 10, 11 and the sense current flowing direction cease to be perpendicular to each other. In this case, in the magneto-resistance effect films 10, 11, the resistance value for the sense current becomes larger than if the external magnetic field is not applied.

With the MR device 1, thus fed with the constant sense current, the change in the resistance value for the sense current is indicated as voltage change of the sense current. That is, the MR device can detect the external magnetic field by outputting the external magnetic field as voltage changes of the sense current.

On the other hand, the sense current magnetic field is generated in the MR device 1 by the sense current flowing through the magneto-resistance effect layer 2. Since the sense current is flowing in the direction indicated by arrow shown by arrow A in FIG. 2, the sense current magnetic field is generated in a direction substantially parallel to the direction of magnetization of the magneto-resistance effect films 10, 11, as indicated by arrow C in FIG. 2. This sense current magnetic field increases the effective anisotropic magnetic field because the direction of the magnetization is substantially parallel to the direction of the magnetization B of the magneto-resistance effect films 10, 11. This effective anisotropic magnetic field enhances the magnetization of the magneto-resistance effect films 10, 11, thus deteriorating the sensitivity of the MR device 1.

On the other hand, the above-mentioned paired anti-ferromagnetic films 3, 3 are formed in a pre-set magnetic field, such as a magnetic field of the order of 1000 Oe (oersted), using techniques such as sputtering, ion beam sputtering (IBS) or molecular beam epitaxy (MBE). Thus the paired anti-ferromagnetic films 3, 3 generate an exchange bias magnetic field in an anti-parallel direction relative to the sense current magnetic field indicated by arrow C in FIG. 2D. At this time, the paired anti-ferromagnetic films 3, 3 are formed so that the magnitude of the exchange bias magnetic field will be approximately equal to that of the sense current magnetic field. In the paired anti-ferromagnetic films 3, 3, the magnitude of the exchange bias magnetic field is controlled by taking into account the material type or film thickness, as an example.

The exchange bias magnetic field accords unidirectional anisotropy to the magneto-resistance effect layers 10, 11, while canceling the sense current magnetic field. That is, in the MR device, the exchange bias magnetic field accords unidirectional anisotropy to the magneto-resistance effect layers 10, 11 for magnetically stabilizing the for preventing the magneto-resistance effect layers 10, 11. Also, with the present MR device 1, the exchange bias magnetic field effective anisotropic magnetic field from being increased with respect to the magneto-resistance effect layers 10, 11.

In addition, with the present MR device, the non-magnetic insulating film 12 is formed in a similar manner to the above-mentioned anti-ferromagnetic films 3. Since the non-magnetic insulating film 12 insulates the first magneto-resistance effect film 10 and the second magneto-resistance effect film 11 from each other, the film 12 establishes magneto-static coupling between these layers without producing exchange coupling therebetween. The first magneto-resistance effect film 10 and the second magneto-resistance effect film 11 cooperate for improving magnetic stability by the magneto-static coupling formed therebetween.

An experiment for verifying that, in the above-described MR device 1, the exchange bias magnetic field generated by the above-mentioned paired anti-ferromagnetic films 3, 3 cancels the effective anisotropic magnetic field for improving sensitivity of the MR device 1, is now explained.

In this experiment, an exchange bias magnetic field from the anti-ferromagnetic films 3, 3 was impressed across the magneto-resistance effect layers 10, 11 and an external bias magnetic field corresponding to the sense current magnetic field was impressed in a parallel or anti-parallel direction for measuring magnetic properties by a vibrating sample magnetometer (VSM) from a direction perpendicular to the exchange bias magnetic field. Specifically, if a magnetization curve exhibiting a steeper gradient is obtained in the present experiment, the exchange bias magnetic field and the external magnetic field are deemed to have been canceled by each other.

In the present experiment, the direction of the external bias magnetic field is minus and plus if it is anti-parallel or parallel to the exchange bias magnetic field, respectively. The present experiment was conducted using three different external bias magnetic fields, namely external bias magnetic fields of −34 (Oe), 0 (Oe) and +34 (Oe), and magnetic properties were checked for these respective cases.

Figure 3:
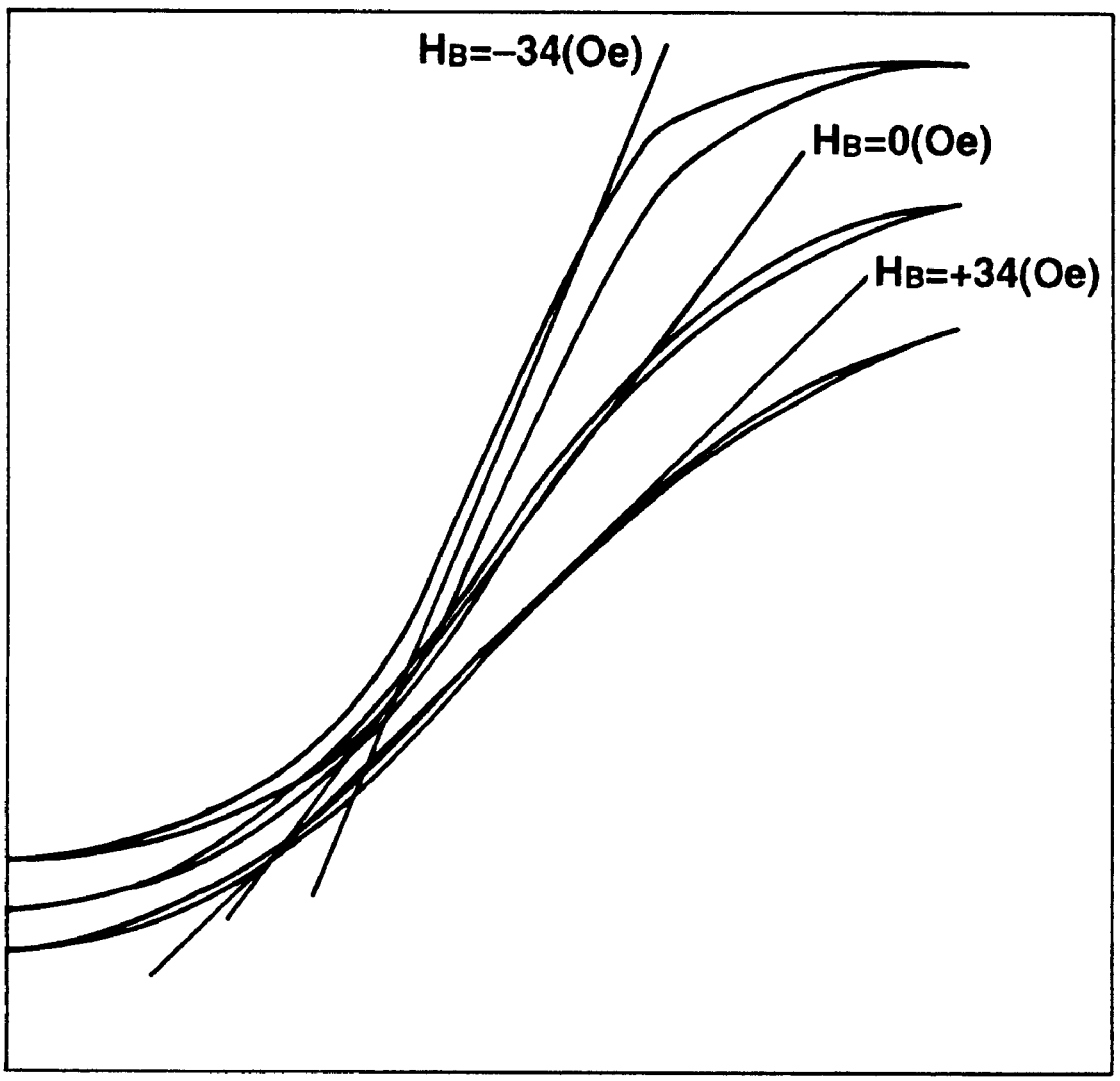
FIG. 3 is a graph for illustrating cancellation of the sense current magnetic field by the exchange bias magnetic field.

The results of the experiment are shown in FIG. 3, from which it is seen that the magneto-resistance effect films 10, 11 showed steepest magnetization curves for the external bias magnetic field of −34 Oe, while showing the most moderate magnetization curve for the external bias magnetic field of +34 Oe.

From this it has become clear that the exchange bias magnetic field and the external bias magnetic field cancel each other if the respective directions of magnetization are anti-parallel with respect to each other. That is, with the MR device 1 of the present invention, the sense current magnetic field can be canceled by the anti-parallel direction of the exchange bias magnetic field generated by the anti-ferromagnetic films 3 with respect to the direction of the sense current magnetic field. This causes the MR device 1 to cancel the effective anisotropic magnetic field for the magneto-resistance effect films 10, 11 thus assuring higher sensitivity.

At this time, the magnitude of the exchange bias magnetic field generated by the anti-ferromagnetic films 3 is preferably larger than the sense current magnetic field. The exchange bias magnetic field larger in magnitude than the sense current magnetic field can magnetically stabilize the entire MR device 1.

The above-described magneto-resistance effect device 1 according to the present invention is employed in a magneto-resistance effect type magnetic head 20 (MR head) configured for reproducing the signal magnetic field recorded on the magnetic recording medium, as will now be explained.

Figure 4:
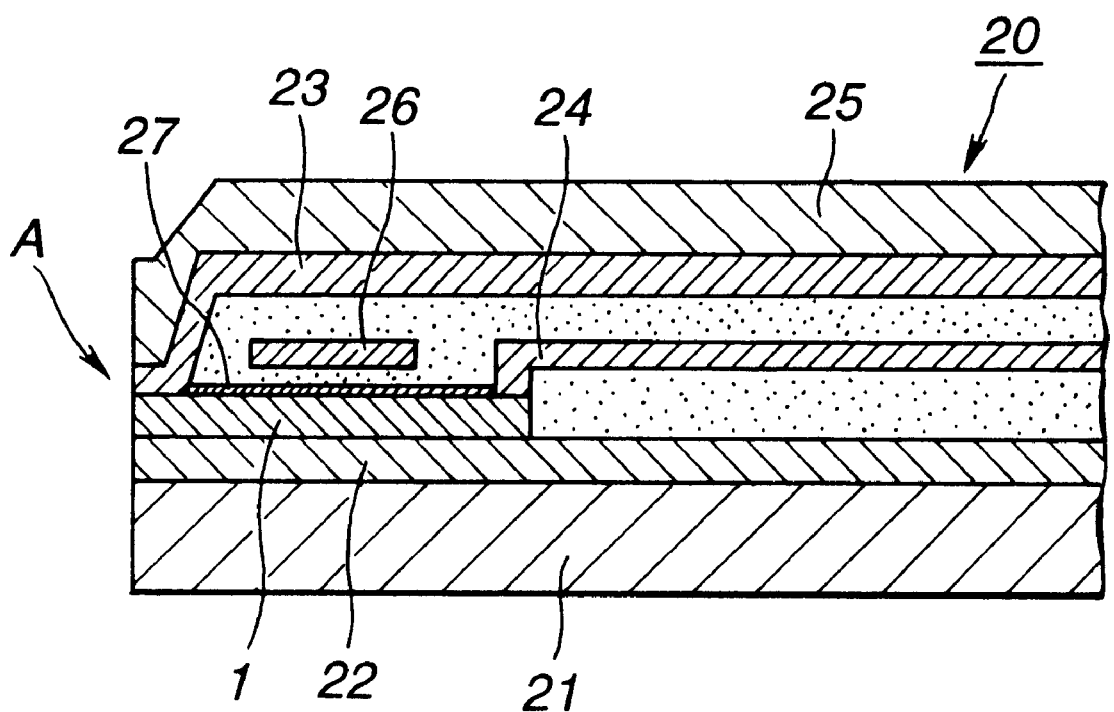
FIG. 4 is a schematic cross-sectional view of a magneto-resistance effect type magnetic head having a magneto-resistance effect device according to the present invention.

Referring to FIG. 4, the MR head 20 employing the MR device 1 includes a lower layer shield 21, a lower gap 22 layered on this lower layer shield 21, the MR device 1 and an upper shield layer 25 layered on the MR device 1. The MR device 1 includes the paired electrodes 4A, 4B layered on the lower gap 22 and which are comprised of a foremost part electrode 23 and a rear-end electrode 24. The MR head 20 includes a bias magnetic field conductor layer 26 for generating the bias magnetic field above the MR device 1. The MR head 20 has on the upper surface of the MR device 1 a protective layer 27 of, for example, $Al_2O_3$.

This MR head 20 reproduces magnetic signals recorded on the magnetic recording medium. On a lateral side shown by arrow A in FIG. 4 of the MR head 20 slides a magnetic recording medium for entering the signal magnetic field recorded on the magnetic recording medium. In the MR head 20, the MR device 1 proves to be a magnetically sensitive portion of the signal magnetic field.

In the MR head 20, the lower layer shield 21 and the upper layer shield 25 are formed of a magnetic material, with the lower gap 22 being formed of a non-magnetic insulating material and with the rear end electrode 24 being formed of a non-magnetic electrically conductive material. The lower layer shield 21, upper layer shield 25, lower gap 22 and the forward end electrode 23 operate for prohibiting the portion of the signal magnetic field from the magnetic recording medium other than the reproducing magnetic field from being pulled into the MR device 1. That is, with the MR head 20, since the lower gap 22 and the forward electrode 23 are arranged on upper and lower sides of the MR device 1, the portion of the signal magnetic field from the magnetic recording medium other than the magnetic field to be reproduced is led to the lower layer shield 21 and to the upper layer shield 25. This enables the MR device 1 to pull in only the portion of the magnetic field to be reproduced.

With the present MR head 20, the bias magnetic field conductor layer 26 generates the bias magnetic field by a pre-set current being supplied during reproduction of the signal magnetic field. The bias magnetic field conductor layer 26 impresses a bias magnetic field across the MR device 1 so that changes in resistance of the MR device 1 exhibits linearity relative to changes in the signal magnetic field. This MR head 20 having the MR device 1 undergoes only little distortion and exhibits high sensitivity with respect to the signal magnetic field.

The MR device 20 is arranged so that, with the magnetic recording medium facing the MR head 20, the longitudinal direction thereof is perpendicular to the magnetic recording medium. In this state, the MR device 1 is buried in the non-magnetic insulating material. The MR device 1 includes a pair of electrodes 4A, 4B comprised of the forward end electrode 23 and the rear-end electrode 24. The paired electrodes 4A, 4B have the foremost part 4A towards the slide surface for the magnetic recording medium and the opposite side rear part 4B as the forward side electrode 23 and the rear-end electrode 24, respectively.

In the above-described MR head 20 having the MR device 1 according to the present invention, having the above-described structure of the MR device 1, the signal magnetic field can be reproduced with high sensitivity at the time of reproduction of the signal magnetic field from the magnetic recording medium. That is, with the present MR head 20, the sense current magnetic field, generated by the sense current supplied to the MR device, can be canceled by the exchange bias magnetic field generated by the paired anti-ferromagnetic films 3, 3 without increasing the effective anisotropic magnetic field for the MR device 1. Thus, the MR head 20 can reproduce the signal magnetic field to high sensitivity. Moreover, if, with the MR head 20, the sense current density is increased for realizing a larger playback output, the effective anisotropic magnetic field can be reduced by increasing the exchange bias magnetic field responsive to the magnitude of the sense current magnetic field, thus enabling the signal magnetic field to be reproduced to high sensitivity.

In the MR device 1 of the above-described first embodiment, the magnetic field detection unit has a pair of magneto-resistance effect films 10, 11 as the magneto-resistance effect layers 2. However, the present invention s not limited to this illustrative structure. Specifically, the magneto-resistance effect device according to the present invention may also be a magneto-resistance effect device 30 (MR device 30) according to a second embodiment, as shown in FIG. 5.

The MR device 30 of the present second embodiment is configured so that the magnetic field detection unit has a sole magneto-resistance effect film 31. In the MR device 30 of the present second embodiment, the parts or components which are the same as those of the MR device of the above-described first embodiment are depicted by the same reference numerals and the detailed description of the structure and the operation thereof is omitted for simplicity.

Figure 5:
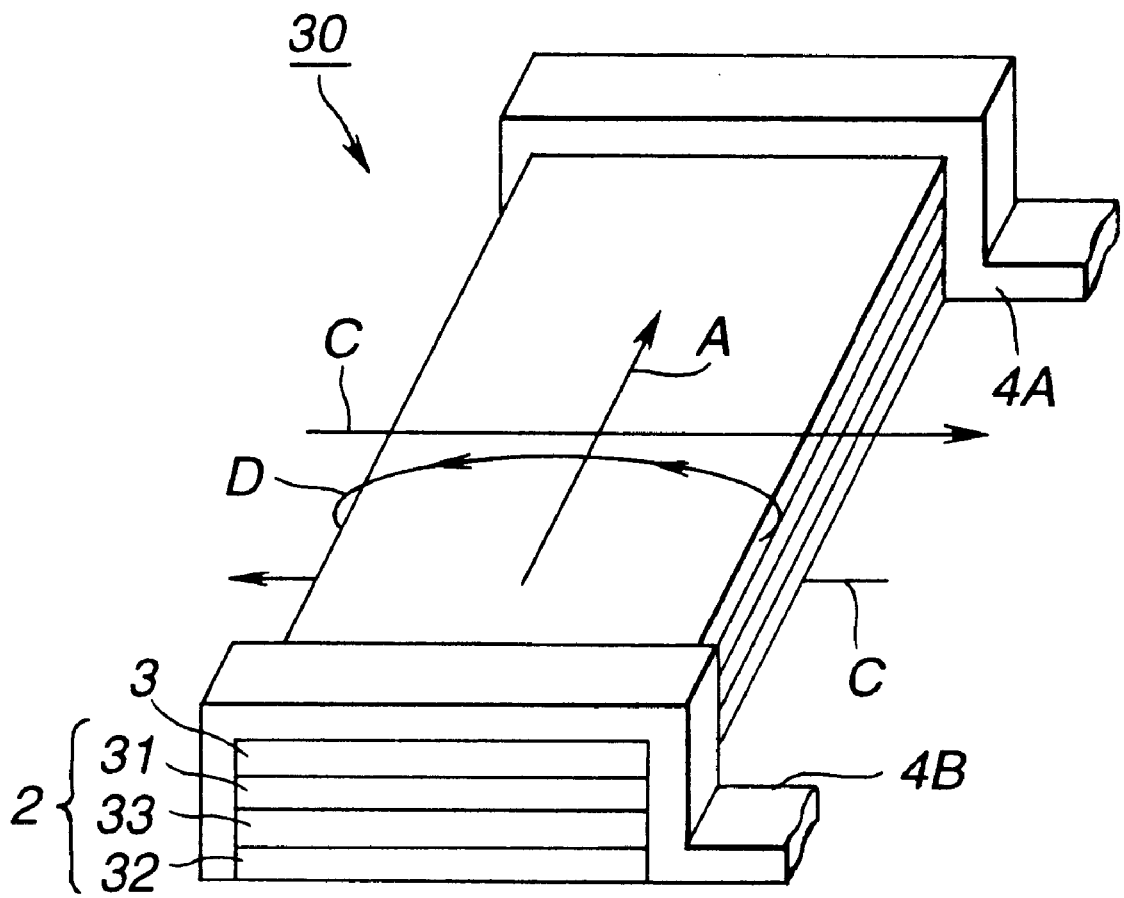
FIG. 5 is a schematic perspective view showing a magneto-resistance effect device according to a second embodiment of the present invention.

Referring to FIG. 5, the MR device 30 includes a substantially rectangular magneto-resistance effect layer 2, an anti-ferromagnetic film 3 neighboring to the magneto-resistance effect layer 2 and a pair of electrodes 4A, 4B formed on both longitudinal ends of the magneto-resistance effect layer 2.

The magnetic field detection unit of the MR device 30 includes a magneto-resistance effect stabilizing layer 32, a non-magnetic insulating film 33 layered on the magneto-resistance effect stabilizing layer 32 and a magneto-resistance effect film 31 layered on the non-magnetic insulating film 33. The magneto-resistance effect stabilizing layer 32 is formed of an amorphous magnetic material or a hard magnetic material, such as Co—Cr—Pt, and operates for magnetically stabilizing the magneto-resistance effect film 31.

The MR device 30 has an anti-ferromagnetic film 3 on a surface thereof opposite to the surface contacted with the non-magnetic insulating film 33. The anti-ferromagnetic film 3 is formed in the same way as in the MR device of the first embodiment described above. Thus, the anti-ferromagnetic film 3 generates an exchange bias magnetic field having the direction indicated by arrow C in FIG. 5. The anti-ferromagnetic film 3 is formed so that the magnitude of the exchange bias magnetic field will be approximately equal to that of the sense current magnetic field.

The exchange bias magnetic field can accord unidirectional anisotropy to the magneto-resistance effect layer 2 and cancel the sense current magnetic field. Specifically, the MR device 30 accords unidirectional anisotropy to the magneto-resistance effect film 31 while magnetically stabilizing the magneto-resistance effect film 31. In the MR device 30, the exchange bias magnetic field operates for canceling the sense current magnetic field for not impressing the effective anisotropic magnetic field across the magneto-resistance effect film 31.

In the present MR device 30, since the magneto-resistance effect film 31 is formed using the technique used for forming the anti-ferromagnetic film 3, unidirectional magnetic anisotropy is also accorded to the magneto-resistance effect film 31.

Similarly to the MR device 1 of the above-described first embodiment, the MR device 30 of the second embodiment can detect the external magnetic field, such as the signal magnetic field, to high sensitivity, and can be used for a magneto-resistance effect type magnetic head used for reproducing the signal magnetic field recorded on the magnetic recording medium.

The present invention is not limited to the magneto-resistance effect device employing the anisotropic magneto-resistance effect, but may be applied to a magneto-resistance effect device employing the giant magneto-resistance effect such as is shown as a third embodiment. In the magneto-resistance effect device of the present third embodiment, the parts or components which are the same as those of the previous embodiments are depicted by the same reference numerals and the detailed explanation therefor is omitted for simplicity.

Figure 6:
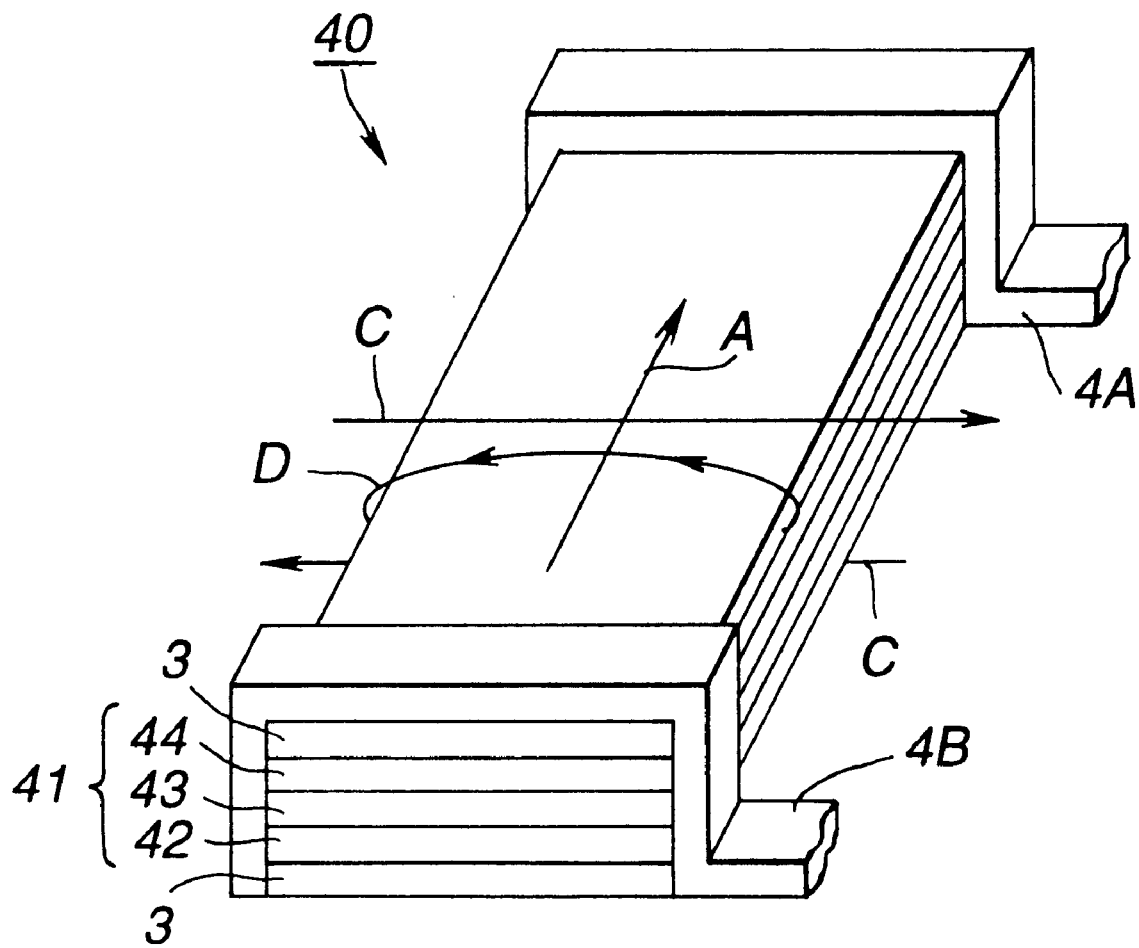
FIG. 6 is a schematic perspective view showing a magneto-resistance effect device according to a third embodiment of the present invention.

Referring to FIG. 6, a magneto-resistance effect device 40 of the present third embodiment (MR device 40) includes a substantially rectangular magneto-resistance effect layer 2, anti-ferromagnetic films 3, 3 neighboring to the magneto-resistance effect layer 2 and a pair of electrodes 4A, 4B provided on both longitudinal ends of the magneto-resistance effect layer 2.

The magneto-resistance effect layer 2 includes a spin-bulb type giant magneto-resistance effect layer 41 exploiting the giant magneto-resistance effect, and is a magnetic field detection unit made up of a fixed layer 42, a non-magnetic electrically conductive layer 43 layered on this fixed layer 42 and a soft magnetic layer 44 layered on the non-magnetic electrically conductive layer 43. In the giant magneto-resistance effect layer 41, the fixed layer 41 is formed of Ni—Fe, Ni—Fe—Co, Fe—Co or Ni—Fe compounded with Co. The non-magnetic electrically conductive layer 43 is formed of a non-magnetic electrically conductive material, such as Cu, Ag or Ru. The soft magnetic layer 44 is formed of a soft magnetic material, such as NiFe.

This giant magneto-resistance effect layer 41 is sandwiched by a pair of anti-ferromagnetic films along the direction of film thickness. The anti-ferromagnetic film 3 arranged neighboring to the fixed layer 42 has its direction of magnetization substantially identical with that of the fixed layer 42. The anti-ferromagnetic film 3 arranged neighboring to the soft magnetic layer 44 has its direction of magnetization substantially anti-parallel to that of the soft magnetic film 44.

Thus, the anti-ferromagnetic film 3 arranged neighboring to the fixed layer 42 fixes the direction of magnetization of the fixed layer 42 so as to correspond to the longitudinal direction of the giant magneto-resistance effect layer 41 by the exchange bias magnetic field. The anti-ferromagnetic film 3 arranged neighboring to the soft magnetic layer 44 impresses the exchange bias magnetic field to the soft magnetic layer by the exchange bias magnetic field for canceling the sense current magnetic field for diminishing the effective anisotropic magnetic field.

With the magneto-resistance effect layer 2, comprised of the giant magneto-resistance effect layer 41, the direction of magnetization of the soft magnetic layer 44 is changed with respect to the external magnetic field 44, such as signal magnetic field, while the direction of magnetization of the fixed layer 42 is not changed. With this giant magneto-resistance effect layer 41, the resistance value with respect to the sense current is changed responsive to the angle between the direction of magnetization and that of the soft magnetic layer. Thus, the MR device 40 can detect the external magnetic field.

Thus, similarly to the MR device 1 of the above-described first embodiment, the MR device 40 can detect the external magnetic field, such as signal magnetic field, to high sensitivity. Also, similarly to the MR device 1 of the above-described first embodiment, the MR device 40 can be used for an MR head for reproducing the signal magnetic field recorded on a magnetic recording medium.

What is claimed is:

1. A magneto-resistance effect device comprising:
   a magnetic field detection unit having a magneto-resistance effect film exhibiting a magneto-resistance effect, said magnetic field detection unit being fed with a sense current in a direction substantially perpendicular to a surface for facing a source of an external magnetic field; and
   an anti-ferromagnetic film arranged neighboring to the magneto-resistance effect film of the magnetic field detection unit; characterized in that
   the direction of a magnetic field emanating from the anti-ferromagnetic film is substantially anti-parallel to the direction of a sense current magnetic field generated by the sense current and impressed on the magneto-resistance effect film of said magnetic field detection unit.

2. The magneto-resistance effect device as claimed in claim 1 characterized in that the magnetic field detection unit includes a pair of magneto-resistance effect films layered with interposition of a non-magnetic insulating layer.

3. The magneto-resistance effect device as claimed in claim 1 characterized in that the magnetic field detection unit includes a hard magnetic film and a magneto-resistance effect film layered with interposition of a non-magnetic insulating layer.

4. The magneto-resistance effect device as claimed in claim 1 characterized in that the magnetic field detection unit is a spin-bulb type giant magneto-resistance effect film having a fixed layer and a free layer layered with interposition of a non-magnetic insulating layer.

5. The magneto-resistance effect device as claimed in claim 1 characterized in that a magnetic field emanating from said anti-ferromagnetic field is larger than a magnetic field generated from the sense current supplied to said magnetic field detection unit.

6. A magneto-resistance effect head comprising:

a magneto-resistance effect thin film exhibiting a magneto-resistance effect, said magneto-resistance effect thin film having its longitudinal direction extending perpendicular to a surface for facing a recording medium and having an easy axis extending in a direction perpendicular to the longitudinal direction;

said magneto-resistance effect thin film having a forward end electrode towards said recording medium and a rear-end electrode on the opposite side, said magneto-resistance effect film being flown through by the sense current in a direction parallel to the longitudinal direction between said electrodes for generating a sense current magnetic field in the same direction as said easy axis; and an anti-ferromagnetic film layered on said magneto-resistance effect film and having a magnetic field in a direction anti-parallel to the sense current magnetic field having the same direction as said easy axis.

7. The magneto-resistance effect head as claimed in claim 6 characterized in that said magneto-resistance effect film has a pair of magneto-resistance effect layers interposed by a non-magnetic insulating layer;

said paired magneto-resistance effect layers each having an easy axis anti-parallel to each other and extending perpendicular to said longitudinal direction.

8. The magneto-resistance effect head as claimed in claim 7 further comprising:

A pair of anti-ferromagnetic layers layered on said paired magneto-resistance effect layers and each having a direction anti-parallel to the direction of the sense current magnetic field which is the same as the easy axis.

9. The magneto-resistance effect head as claimed in claim 6 characterized in that said magneto-resistance effect film is layered on a hard magnetic layer with interposition of a non-magnetic insulating layer.

10. The magneto-resistance effect head as claimed in claim 6 characterized in that said magneto-resistance effect film is a spin-bulb type giant magneto-resistance effect device having a fixed layer and a free layer layered with interposition of a non-magnetic electrically conductive layer.

* * * * *